(12) United States Patent
Chainer et al.

(10) Patent No.: US 9,875,953 B2
(45) Date of Patent: Jan. 23, 2018

(54) INTERLAYER CHIP COOLING APPARATUS

(71) Applicant: International Business Machines Corporation, Armonk, NY (US)

(72) Inventors: Timothy J. Chainer, Putnam Valley, NY (US); Pritish R. Parida, Fishkill, NY (US); Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 14/744,944

(22) Filed: Jun. 19, 2015

(65) Prior Publication Data

US 2016/0128232 A1 May 5, 2016

Related U.S. Application Data

(60) Provisional application No. 62/072,055, filed on Oct. 29, 2014.

(51) Int. Cl.
| | |
|---|---|
| *H05K 7/20* | (2006.01) |
| *H01L 23/04* | (2006.01) |
| *H01L 23/427* | (2006.01) |
| *H01L 23/367* | (2006.01) |
| *H01L 23/473* | (2006.01) |
| *H01L 23/373* | (2006.01) |

(52) U.S. Cl.
CPC ........ *H01L 23/427* (2013.01); *H01L 23/3735* (2013.01); *H01L 23/473* (2013.01); *H01L 2924/0002* (2013.01)

(58) Field of Classification Search
CPC ........ G06F 1/20; H05K 1/183; H05K 1/0212; H05K 2201/10977; H05K 3/284; H05K 7/202; H05K 7/20436; H05K 7/205; H01L 23/5389; H01L 23/427; H01L 23/3735; H01L 23/473; H01L 2924/0002
See application file for complete search history.

(56) References Cited

U.S. PATENT DOCUMENTS 3,921,201 A * 11/1975 Eisele ............... H01L 23/427
165/80.4
4,561,040 A   12/1985 Eastman et al.
(Continued)

OTHER PUBLICATIONS

Chainer et al., "Distribution and Stabilization of Fluid Flow for Interlayer Chip Cooling", U.S. Appl. No. 14/976,135, filed Dec. 21, 2015.

(Continued)

*Primary Examiner* — James Wu
*Assistant Examiner* — Michael Matey
(74) *Attorney, Agent, or Firm* — Nicholas D. Bowman

(57) ABSTRACT

An integrated circuit (IC) can be cooled by using a structure that includes two elements, such as integrated circuits (ICs) or electronic packages, in a stacked arrangement, with the elements having surfaces that face each other. The structure also includes a pair of fluidic channel boundaries, between the facing surfaces, where each fluidic channel boundary is formed by an arrangement of adjacent discrete connecting structures. The primary and secondary fluidic channel boundaries and the facing surfaces define a fluidic channel that is useful for promoting boiling of and directing the flow of a refrigerant between the two surfaces.

19 Claims, 6 Drawing Sheets

(56) References Cited

U.S. PATENT DOCUMENTS

| | | | |
|---|---|---|---|
| 4,718,163 A * | 1/1988 | Berland | H05K 1/0272 174/16.3 |
| 5,514,906 A | 5/1996 | Love et al. | |
| 7,104,312 B2 * | 9/2006 | Goodson | F04B 19/006 165/104.33 |
| 7,274,568 B1 | 9/2007 | Chayut | |
| 7,528,483 B2 | 5/2009 | Chen et al. | |
| 7,990,711 B1 * | 8/2011 | Andry | H01L 23/147 165/80.4 |
| 8,305,762 B2 | 11/2012 | Wits et al. | |
| 8,581,392 B2 | 11/2013 | Knickerbocker et al. | |
| 8,659,897 B2 | 2/2014 | Meijer et al. | |
| 8,729,692 B2 * | 5/2014 | Kim | H01L 23/473 257/690 |
| 8,829,670 B1 * | 9/2014 | Zhang | H01L 23/473 257/713 |
| 8,953,314 B1 * | 2/2015 | Fedorov | H01L 23/44 257/707 |
| 2009/0108435 A1 * | 4/2009 | Bernstein | H01L 23/473 257/691 |
| 2009/0311826 A1 * | 12/2009 | Bernstein | H01L 23/473 438/106 |
| 2010/0290188 A1 * | 11/2010 | Brunschwiler | H01L 23/473 361/699 |
| 2011/0235279 A1 * | 9/2011 | Mori | H01L 23/3735 361/717 |
| 2012/0314369 A1 * | 12/2012 | Wu | H01L 23/427 361/701 |
| 2013/0284404 A1 * | 10/2013 | Matsushima | B23P 15/26 165/104.19 |
| 2014/0041836 A1 | 2/2014 | Schuette | |

OTHER PUBLICATIONS

Brunschwiler et al., "Counter-Flow Expanding Channels for Enhanced Two-Phase Heat Removal", U.S. Appl. No. 14/976,106, filed Dec. 21, 2015.

Chainer et al., "Chip Embedded Interlayer Cooling with Wetted Heterogeneous Interconnect Field," U.S. Appl. No. 62/072,055, filed Oct. 29, 2014.

Chainer et al., "Active Control for Two-Phase Cooling," U.S. Appl. No. 14/636,648, filed Mar. 3, 2015.

* cited by examiner

INTERLAYER CHIP COOLING APPARATUS

CROSS REFERENCE TO RELATED APPLICATION

This application is related to and claims the benefit of U.S. Provisional Patent Application No. 62/072,055, filed Oct. 29, 2014, which application is incorporated by reference herein for all purposes.

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights in this invention.

BACKGROUND

The present disclosure generally relates to the cooling of integrated circuit (IC) chips. In particular, this disclosure relates to two-phase embedded cooling of processor chips in a stacked arrangement within a three-dimensional integrated circuit (3-D IC).

During the operation of an IC, electrical power consumed by the IC is dissipated as heat. The amount of heat an IC dissipates can be proportional to its operating voltage(s) and frequency, as well as the number of inputs, outputs, and active circuits within the IC.

SUMMARY

Various aspects of the present disclosure may be useful for providing efficient cooling and thermal management of integrated circuits (ICs) within an electronic system. An IC cooling structure configured according to embodiments of the present disclosure may provide directed flow of refrigerant in a two-phase cooling solution of one or more ICs arranged in a stacked configuration, such as a three-dimensional integrated circuit (3-D IC).

Embodiments may be directed towards a structure for use with an integrated circuit (IC). The structure can include a first element having a first surface and a second element in a stacked arrangement with the first element, the second element having a second surface disposed opposite to the first surface. The structure can also include a set of discrete connecting structures disposed between the first surface and the second surface. The structure can also include a first fluidic channel boundary formed by a structured arrangement of a first portion of the set of discrete connecting structures. The structured arrangement can be sufficient to create, within the first fluidic channel boundary, a first internal fluidic impedance that is greater than an external fluidic impedance outside of the first fluidic channel boundary.

Embodiments may also be directed towards a system for removing heat from an integrated circuit (IC). The system can include a structure that can include the IC, in thermally conductive contact with a first surface of the structure. The structure can also include a first element, the first element having the first surface and a second element in a stacked arrangement with the first element, the second element having a second surface disposed opposite to the first surface. The structure can also include a first fluidic channel boundary including a first portion of a set of discrete connecting structures, the first fluidic channel boundary disposed between the first surface and the second surface. The structure can also include a second fluidic channel boundary including a second portion of the set of discrete connecting structures, the second fluidic channel boundary disposed between the first surface and the second surface. The first and second fluidic channel boundaries and the first and second surfaces define a fluidic channel. The structure can also include an inlet port, the inlet port disposed adjacent to a first end of the fluidic channel, an outlet port, the outlet port disposed adjacent to a second end of the fluidic channel and a primary cooling loop that is coupled to the outlet port and to the inlet port. The primary cooling loop can include a condenser, the condenser having an inlet port coupled to the outlet port of the structure, the condenser further having an outlet port coupled to an inlet port of a coolant reservoir. The primary cooling loop can also include the coolant reservoir, the coolant reservoir having an outlet port coupled to an inlet port of a first pump and the first pump, the first pump having an outlet port coupled to the inlet port of the structure, the first pump configured to pump coolant through the structure.

Embodiments may also be directed towards a method of operating a structure for cooling an integrated circuit (IC). The method can include pumping a coolant from a coolant reservoir into the structure, where a first surface of the structure is in thermally conductive contact with the IC. The structure can include a first element, the first element having the first surface and a second element in a stacked arrangement with the first element, the second element having a second surface disposed opposite to the first surface. The structure can also include a first fluidic channel boundary including a first portion of a set of discrete connecting structures, the first fluidic channel boundary disposed between the first surface and the second surface. The structure can also include a second fluidic channel boundary including a second portion of the set of discrete connecting structures, the second fluidic channel boundary disposed between the first surface and the second surface, wherein the first and second fluidic channel boundaries and the first and second surfaces define a fluidic channel. The structure can also include an inlet port, the inlet port disposed adjacent to a first end of the fluidic channel and an outlet port, the outlet port disposed adjacent to a second end of the fluidic channel. The method can also include transferring heat from the IC to the coolant by flow boiling the coolant in the fluidic channel, pumping the coolant from the structure and into a condenser and condensing, in the condenser, the coolant from a vapor phase to a liquid phase. The method can also include transferring, in a liquid phase, the coolant from the condenser to the coolant reservoir and removing heat from the coolant in the coolant reservoir by circulating a secondary coolant through the coolant reservoir.

Aspects of the various embodiments may be used to efficiently transfer heat from one or more ICs. Aspects of the various embodiments may also be useful for providing cost-effective and efficient cooling for ICs and electronic devices, by using existing and proven discrete connecting structure design, simulation/analysis and fabrication technologies.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 1 includes a top view, a detail view, and a cross-sectional view of an integrated circuit (IC) cooling structure with fluidic channels including fine-pitch discrete connecting structures, according to embodiments of the present disclosure.

Figure 1:
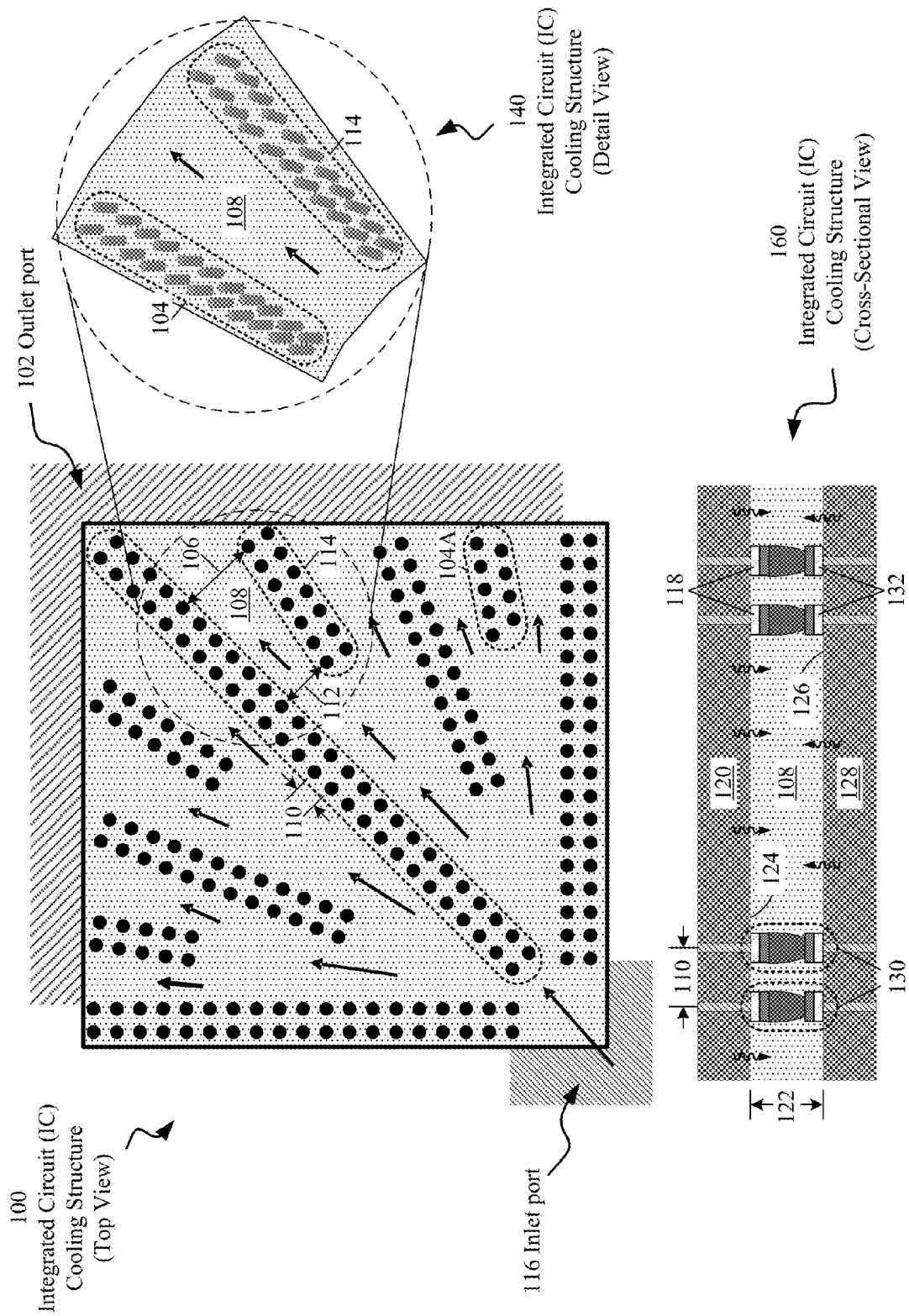

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

The present disclosure may be a structure, a system or a method. Certain embodiments of the present disclosure can be appreciated in the context of providing enhanced cooling capacity for integrated circuits (ICs) such as processor chips, which may be used to provide computational capability for electronic devices such as computers and servers. Such computers and servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing enhanced cooling capacity for ICs such as special-purpose processors, which may be used in a wide variety of computational and data processing applications. Such computing systems may include, but are not limited to, supercomputers, high-performance computing (HPC) systems, and other types of special-purpose computers. Embodiments may also be directed towards providing enhanced cooling capacity for ICs arranged in stacked, high-density configurations, for example, in three-dimensional integrated circuit (3-D IC) structures.

For ease of discussion, the term "discrete connecting structure(s)" is used herein with reference to various structure(s) used to mechanically, electrically and/or thermally connect two elements. It is understood, however, that in certain embodiments, a discrete connecting structure may be a metallic post, pillar or through-silicon via (TSV). The term "coolant" is used herein in reference to a fluid used to transfer heat from an IC cooling structure to a remote location such as an outdoor ambient environment. It is understood, however, that in certain embodiments the coolant may be a refrigerant which may exist in a liquid and/or a vapor phase within an IC cooling system. In the context of a primary cooling loop connected to an IC cooling structure, the terms "coolant" and "refrigerant" may be used interchangeably. For ease of discussion, the term "flow boiling" is used herein with reference to the process of boiling a coolant or refrigerant while it flows, for example, through a fluidic channel and/or cooling structure, where it can absorb heat.

A heat-producing electronic device such as an IC may be cooled by a thermally dissipative device, for example, an air-cooled heat sink, or through liquid cooling, to limit the device's operating temperature. High device operating temperatures resulting from excessive heat dissipation can shorten the operating life of an IC by causing premature failure, and can reduce its operating capability. Limiting the operating temperature of an IC to a specified range may allow it to operate reliably and perform within a specified performance range for the duration of a specified operating life.

In certain applications however, for example, where one or more ICs dissipate a large amount of power as heat, and particularly when the ICs are configured in a stacked arrangement, such as a 3-D IC, a heat sink or conventional liquid cooling technologies may not be sufficient to effectively limit the IC's operating temperature within a specified range. In these applications, flow boiling of a coolant or refrigerant within an IC cooling structure that provides thermally conductive contact with the IC may be useful for the removal or transfer of heat from the IC. Such a cooling structure may be useful in significantly increasing the amount of heat which may be transferred from one or more ICs, to a remote location, relative to an air-cooled or conventional liquid-cooled heat removal scheme. Increasing heat transfer from an IC may be useful in extending the IC's performance and/or reliability during operation. In certain embodiments, efficient heat transfer from the IC may allow the IC to dissipate an increased amount of heat, which may in turn allow the IC to be operated at a higher frequency and yield higher device and/or system performance, relative to an IC and IC cooling structure or device having less efficient heat transfer characteristics.

Various embodiments of the present disclosure relate to an IC cooling structure and related system configured to efficiently remove heat from one or more ICs with an electronic system. The IC cooling structure may therefore be useful for providing a managed thermal profile and relatively low operating temperatures for an IC die. Improved IC stability, reliability and performance may result from the use of an IC cooling structure. ICs in thermally conductive contact with the IC cooling structure may experience increased computational capability. The IC cooling structure may help to reduce the amount of energy expended by an electronic system to remove dissipated heat from one or more ICs, particularly ICs configured in a stacked arrangement such as a 3-D IC.

IC cooling structures designed according to embodiments may be useful in simultaneously providing directed paths for efficient flow boiling of refrigerant and an adequate quantity of fine-pitch discrete connecting structures useful for electrically interconnecting adjacent semiconductor die in a stacked arrangement.

An IC cooling structure and related IC cooling system designed according to certain embodiments may be compatible with existing and proven electronic equipment enclosures and electronic hardware interconnection solutions, and may be a useful and cost-effective way to enhance thermal management of ICs and electronic assemblies. An IC cooling structure constructed according to embodiments of the present disclosure may be installed on an existing electronic equipment platform.

An IC cooling structure fabricated according to embodiments may provide a plurality of fluidic channels in efficient thermal contact with an IC, for the flow boiling of a coolant/refrigerant to remove, during operation, heat from the IC. The fluidic channels can be created from groups of fine-pitch discrete connecting structures formed between two elements. The elements can include the IC(s), silicon interposer(s) or other types of electronic package(s), placed in efficient thermal contact with one or more IC(s). A fluidic channel that is tapered can provide expansion paths for coolant vapor formed during flow boiling of the coolant, and thereby promote efficient flow of both liquid and vapor phases of coolant/refrigerant. The two-phase, i.e., liquid phase and vapor phase, flow boiling of coolant within the fluidic channels can provide a uniform temperature across a heat-producing IC die and can provide efficient removal of large amounts of heat from one or more IC(s) arranged in a stacked configuration, e.g., a 3-D IC. Various embodiments of the present disclosure relate to a cooling structure that includes a fluidic channel that is tapered and thereby configured to allow expansion and uninhibited flow of a coolant that is boiled as it flows within the cooling structure.

FIG. 1 includes a top view 100, a detail view 140, and a cross-sectional view 160 of an IC cooling structure that includes element 120 and element 128 in a stacked arrangement, connected by discrete connecting structures 130. The IC cooling structure may be useful in containing coolant in thermally conductive contact with a heat-producing IC. During operation of the IC, the coolant flowing within the IC cooling structure may be boiled in response to receiving heat dissipated by the IC.

In certain embodiments, at least one of the elements 120 and 128 are IC die, such as processor chips, and in particular embodiments, elements 120 and 128 are silicon interposers or other types of electronic packages having at least one surface, e.g., 124 and/or 126, in thermally conductive contact with the IC die.

In embodiments, discrete connecting structures 130 may be metallic posts, including structures such as TSVs, which can be useful for creating electrical, mechanical and thermal connections between the elements 120 and 128. Discrete connecting structures 130 can be attached to elements 120 and 128, for example, by a solder connection to corresponding sets of metallic attachment sites or pads 118 and 132, formed on the facing surfaces 124 and 126, respectively, of elements 120 and 128.

Fluidic channel boundaries 104 and 114 may be formed by the arrangement of discrete connecting structures 130 into fine-pitch groups. In certain embodiments, the fine-pitch groups are arranged in a substantially linear "inline" formation, e.g., fluidic channel boundary 104. In particular embodiments, the fine-pitch groups are arranged in substantially linear "staggered" formation, e.g., fluidic channel boundary 104A. Both fluidic channel boundaries 104 and 104A can be useful in promoting efficient coolant flow through fluidic channel 108. Other discrete connecting structure 130 arrangements are possible.

The spacing between discrete connecting structures 130, within a fluidic channel boundary 104, can be arranged to result in a fluidic/flow impedance or fluidic pressure drop, $\Delta p_1$, within the fluidic channel boundary 104 greater than a fluidic pressure drop, $\Delta p_2$, outside of the fluidic channel boundary 104, for example, within the fluidic channel 108. For example, in one embodiment, discrete connecting structures 130 may have a diameter or width of 25 µm, and a spacing between adjacent discrete connecting structures 130 of 25 µm, with a resulting pitch of 50 µm. This width and spacing combination may result in a fluidic impedance higher than the fluidic impedance within the fluidic channel 108, which may be useful for guiding coolant through the fluidic channel 108. In such embodiments, the structured arrangement of discrete connecting structures 130 within a fluid channel boundary 104 may act as virtual "walls" to direct and guide the coolant flow, while the discrete connecting structures 130 may be individually useful for conducting electrical signals between the first and second elements, e.g., ICs and/or electronic packaging structures. According to embodiments, discrete connecting structures 130 may also be useful for providing mechanical support between the first and second elements and for providing surface area and nucleation sites useful for transferring heat to and/or flow boiling coolant passing through the fluidic channel 108.

In certain embodiments, the spacing between adjacent discrete connecting structures 130 may be different at one location within a particular fluidic channel boundary, e.g., 104, than a spacing between adjacent discrete connecting structures 130 at another location within the fluidic channel boundary. Varying the spacing between adjacent discrete connecting structures 130 may be useful in providing a corresponding variation of a fluidic pressure drop, $\Delta p_1$, at different locations of a particular fluidic channel boundary. Arranging the spacing between adjacent discrete connecting structures to result in a variation of fluidic pressure drop may be useful to direct or guide the flow of a coolant through a fluidic channel.

In certain embodiments, the two fluidic channel boundaries, e.g., 104 and 114, used to define a fluidic channel 108, may be positioned in a divergent orientation to each other between the facing surfaces 124 and 126 of the elements 120 and 128, respectively, resulting in the fluidic channel being tapered. For example, a portion of fluidic channel 108 may have a channel width 112 that is less than the channel width 106 of another portion of the fluidic channel 108. In certain embodiments, surfaces 124 and 126 may be positioned in a divergent orientation to each other, which may also result in the fluidic channel 108 being tapered. A fluidic channel 108 that is tapered may be useful in providing an area that allows room for expansion of the coolant from a liquid phase to a vapor phase during flow boiling.

Fluidic channel boundaries 104 and 114, in conjunction with surfaces 124 and 126 are used to define fluidic channel 108. In certain embodiments sidewalls or containing structures may be created by placing material between the edges of elements 120 and 128 to create a sealed cooling chamber between the elements. In embodiments, the inlet port 116 and an outlet port 102 may be formed in conjunction with such sidewalls or containing structures. In particular embodiments the IC cooling structure 100 may be located within an enclosure that creates a closed, sealed system for containing coolant or refrigerant.

In embodiments, a number of fluidic channels 108 can be formed between the surfaces 124 and 126 through the placement of additional fluidic channel boundaries, as depicted in view 100. In certain embodiments, a number of sealed cooling chambers may be created by arranging additional elements, e.g., IC die, in a stacked arrangement with elements 120 and 128. Directing the flow of refrigerant through fluidic channels such as 108, over the entire surface of an IC may be useful in increasing the effective amount of IC surface area used for heat transfer.

Fluidic channel boundaries 104 and 114 may be useful in guiding the flow of a coolant or refrigerant, as depicted by the flow arrows in views 100 and 140, from inlet port 116, through fluidic channel 108, to outlet port 102.

In certain embodiments, in order to provide sufficient cross-sectional area for coolant flow within fluidic channel 108, a discrete connecting structure height 122 of approximately 150 µm, may be combined with a fine, e.g., 50 µm, discrete connecting structure pitch 110. A process flow for fabricating these relatively tall, fine-pitch discrete connecting structures is depicted and described in reference to FIG. 6, below.

Simulation results from critical heat-flux (CHF), 2-phase pressure drop and heat transfer simulations can indicate that particular combinations of diameters and spacings between discrete connecting structures, arranged as fluidic channel boundaries, can provide a significant refrigerant pressure differential from one side of a fluidic channel boundary to the other. This pressure differential may cause the fluidic channel boundary to act as a "wall" or boundary that is useful for guiding the flow of a refrigerant through a fluidic channel 108.

For example, simulation results may indicate that a set of relatively densely packed "fine-pitch" discrete connecting structures having a diameter of approximately 25 µm and a pitch 110, between adjacent discrete connecting structures of approximately 25 µm may be useful in creating fluidic channel boundaries within an IC cooling structure. In certain embodiments, other combinations of discrete connecting structure diameters and spacings may also be useful in creating fluidic channel boundaries. In embodiments, discrete connecting structures having a height 122 of approximately 150 µm may be useful in providing a fluidic channel that is large enough to allow coolant flow sufficient to cool a high-power IC, e.g., an IC dissipating greater than 200 W. Such discrete connecting structures may be fabricated using existing processes and materials, for example, processes used to create TSVs, and materials such as copper and various solder alloys. Fluidic channel boundaries created from discrete connecting structures may be arranged between surfaces of elements within an IC cooling structure at a minimum channel width 112 of 75 µm, for example, to allow for liquid and vapor flow through the fluidic channel formed by the fluidic channel boundaries.

According to embodiments, discrete connecting structures may act in conjunction with surfaces, e.g., 124 and 126, in providing surface area and nucleation sites useful for the transfer of heat dissipated by the IC to the refrigerant flowing through fluidic channel 108. The fine nature of the gaps between discrete connecting structures can promote formation of a thin liquid film of refrigerant that remains attached to, i.e., "wets", the discrete connecting structures during flow boiling, which can be useful for two-phase heat transfer from the IC to the refrigerant. During the transfer of heat from the IC to the coolant, the coolant can be flow boiled within the fluidic channel(s), which can cause a large volume expansion of the coolant as it transitions from a liquid state to a vapor state. For example, the volume of the coolant in the vapor or gaseous state may be between ≈30× and ≈2000× of the liquid state volume of the coolant. Such a volume expansion could potentially block the flow of the coolant from the inlet port to the outlet port of the IC cooling structure if a sufficiently large cross-section for coolant flow is not provided. The fluidic channel, e.g., 108, can be tapered to allow increasing room for the significant expansion of the liquid coolant into bubbles and vapor, during nucleation, as it flows through the channel. These characteristics can be useful in suppressing flow instabilities which may arise in a fluidic channel having a fixed width, i.e., non-tapered, fluidic channel. In embodiments, fluidic channels may be created in various configurations in order to balance two-phase coolant flows resulting from simulated and/or expected heat dissipation distributions within particular ICs.

Flow boiling of a coolant or refrigerant within an IC cooling structure that includes, or is in efficient thermal contact with, an IC die may be useful to provide a relatively low operating temperature that is generally uniform across the span of the IC die.

The process of flow boiling takes advantage of the latent heat of vaporization of a coolant or refrigerant, which can be significantly greater than the heat transfer required to raise the temperature of a coolant that is not at a boiling point or saturation temperature, i.e., the specific heat of the coolant. For example, a latent heat of vaporization for R1234ze refrigerant may be approximately 163 kJ/kg, as compared to a specific heat of a conventional liquid coolant, e.g., deionized water, of 4.17 kJ/kg ° C.

The relatively uniform IC operating temperature conditions that may result from cooling the IC using coolant flow boiling may result in the reduction or management of thermal gradients across the surface of the IC. The reduction of thermal gradients may be useful in managing corresponding performance differences between areas of the IC which may characteristically dissipate more power, and consequently operate at a higher temperature, than areas of the IC that dissipate relatively less power, and operate at lower temperatures. Reduction of IC operational temperature gradients may be useful in reducing or simplifying simulation and design margins implemented to account for operational temperature gradients, and may enable higher overall IC performance, i.e., frequency or throughput. A relatively low IC operating temperature achieved through flow boiling may also be useful in allowing the IC to operate at a higher frequency or performance level than may be realizable using other types of IC cooling schemes.

For example, a cooling scheme that employs "pool boiling", or the boiling of a coolant or refrigerant that is not flowing through a fluidic channel under pressure, may result in IC thermal gradients due to local differences in heat dissipation across the surface of the IC die. Local heat dissipation differences may result in increased nucleation and resulting heat transfer in specific areas, which may have a limited effect on mitigating IC die temperature gradients. In contrast, the process of flow boiling promotes two-phase, i.e., liquid and vapor, heat transfer uniformly across the surface of the IC die or IC cooling structure in contact with the refrigerant.

The IC cooling structure, according to embodiments, may provide for more efficient transfer of heat from a heat-producing IC to a remote location than a comparable air or liquid-cooled device or scheme. An air-cooled IC cooling device may include several thermally conductive layers between the IC and the cooling air used for dissipation of the heat. For example, an IC semiconductor substrate such as a processor core may be thermally connected to a heat spreader through a layer of thermal interface material (TIM), and the heat spreader may be thermally connected to a heat sink through another TIM layer. Heat generated by an IC is conducted through the semiconductor substrate and each of the TIM, heat spreader and heat sink layers in order to be dissipated by the heat sink. Certain applications may include additional layers such as solder and heat-pipe walls. Each of these described layers may offer thermal resistance to the flow of heat from the IC to the cooling air or other medium, which in turn may limit heat removal and the maximum power and performance of the electronic device.

The total thermal resistance for an example air-cooled processor can be ≈0.24° C./W, which for a 250 W processor can result in a 60° C. temperature difference between the processor core junction and the ambient air temperature. An ambient air temperature for a data center having a computer system with a processor, for example, may be ≈25° C., which can result in a processor core temperature of ≈85° C., which may be prohibitively high for reliable long-term operation of the processor. Relatively high processor core temperatures such as 85° C. may also effectively limit the performance, e.g., frequency or throughput of the processor.

Embodiments of the present disclosure can lower the thermal resistance between a processor and the cooling medium, e.g., air or liquid coolant, to ≈0.04° C./W or less. This lower thermal resistance can be useful in reducing the processor core junction temperature, which can in turn be useful in minimizing processor power consumption relative to a processor operated at comparable throughput but at a higher temperature. Lower thermal resistance can also be useful in supporting higher power consumption levels within a processor core.

Critical heat-flux (CHF), two-phase pressure drop and heat transfer simulations for R1234ze refrigerant at a saturation temperature ($T_{sat}$) of 30° C., and a saturation pressure ($P_{sat}$) of 5.78 bar can be used to generate a design guide such as Table 1. Table 1 may be useful as a reference during the electrical and thermal design of devices including multiple ICs in a stacked configuration. Table 1 may be particularly useful to a device designer during the placement process for fine-pitch and coarse-pitch discrete connecting structures, such as metallic posts or TSVs.

TABLE 1

| CHF, 2-Phase Pressure Drop and Heat Transfer Simulation Results | | | | |
|---|---|---|---|---|
| Fluid Flow x-section width (μm) | Fluid Flow x-section height (μm) | Wall thickness/ connecting structure diameter (μm) | Max Length (μm) | Max Base Heat Flux (W/cm²) |
| 50 | 50 | 40 | 3000 | 100 |
| 50 | 75 | 40 | 3000 | 150 |
| 50 | 50 | 80 | 3000 | 65 |
| 50 | 75 | 80 | 3000 | 100 |
| 50 | 50 | 40 | 9000 | <1 |
| 50 | 75 | 40 | 9000 | 30 |
| 50 | 100 | 40 | 9000 | 35 |
| 50 | 50 | 80 | 9000 | <1 |
| 50 | 75 | 80 | 9000 | 20 |
| 50 | 100 | 80 | 9000 | 25 |
| 75 | 100 | 80 | 9000 | 55 |
| 75 | 150 | 80 | 9000 | 80 |
| 75 | 200 | 80 | 9000 | 100 |
| 100 | 50 | 80 | 9000 | 25 |
| 100 | 100 | 80 | 9000 | 65 |
| 100 | 150 | 80 | 9000 | 110 |
| 100 | 200 | 80 | 9000 | 125 |

Figure 2:
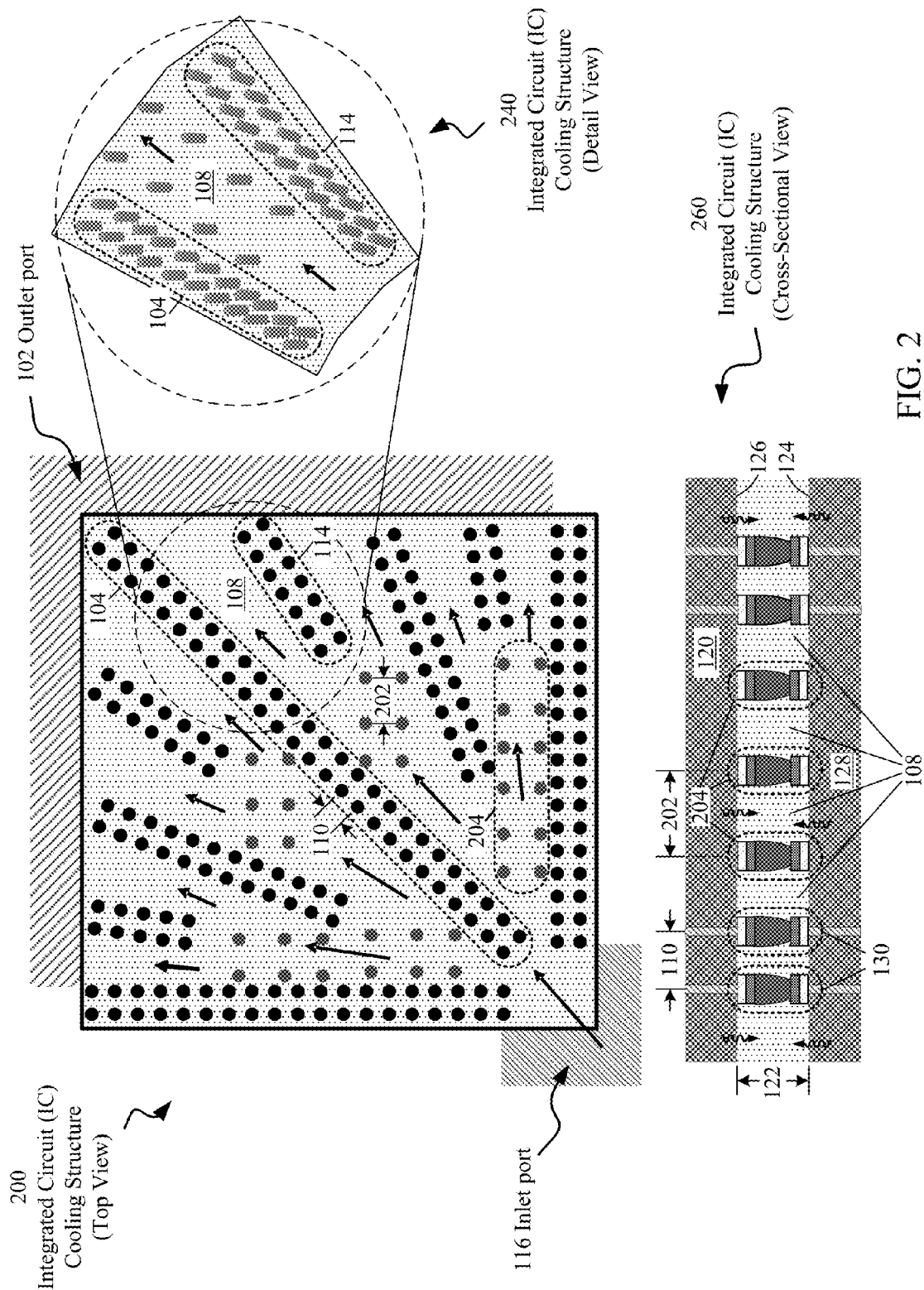
FIG. 2 includes a top view, a detail view, and a cross-sectional view of an IC cooling structure including coarse-pitch discrete connecting structures, according to embodiments consistent with the figures.

FIG. 2 includes a top view 200, a detail view 240, and a cross-sectional view 260 of an IC cooling structure including coarse-pitch discrete connecting structures 204, according to embodiments consistent with the figures. Coarse-pitch discrete connecting structures 204 may be useful in providing mechanical/structural support and electrical interconnection in addition to that provided by fine-pitch discrete connecting structures 130, between element 120 and element 128. Discrete connecting structures 204 may also be useful for providing additional surface area and nucleation sites for heat transfer, which may be useful in the process of flow boiling coolant that passes through fluidic channel 108. In embodiments, pitch 202 is greater than pitch 110, which may be useful in not significantly disrupting coolant flow paths determined by fluidic channel boundaries, for example, 104 and 114. In certain embodiments, discrete connecting structures 204 may have a pitch 202 that is greater than 50 μm, and in certain embodiments discrete connecting structures 204 may have a pitch that is approximately 200 μm. In particular embodiments, the discrete connecting structures 204 may have a width or diameter that is consistent with the width or diameter of discrete connecting structures 130, and in certain embodiments the discrete connecting structures 204 may have a width or diameter that is greater than the width or diameter of discrete connecting structures 130.

Figure 3:
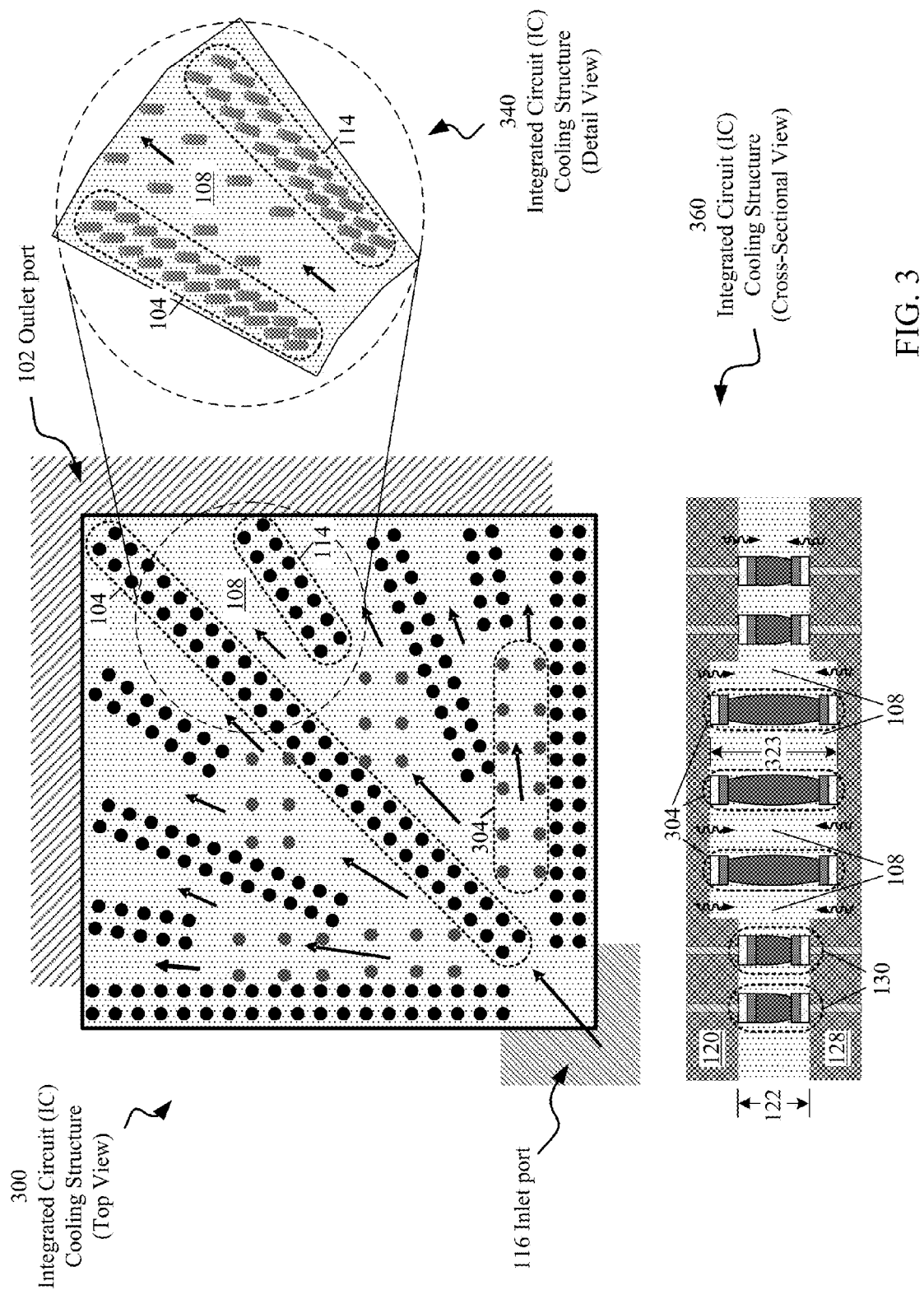
FIG. 3 includes a top view, a detail view, and a cross-sectional view of an IC cooling structure including coarse-pitch discrete connecting structures of varying heights, according to embodiments consistent with the figures.

FIG. 3 includes a top view 300, a detail view 340, and a cross-sectional view 360 of an IC cooling structure including coarse-pitch discrete connecting structures 304, according to embodiments consistent with the figures. In embodiments, coarse-pitch discrete connecting structures 304 have a height 323 that is greater than the height 122 of discrete connecting structures 130. The fluidic channel 108 having height 323 may be useful in allowing an increased volume of coolant to flow between the elements 120, 128 of the IC cooling structure, relative to the IC cooling structure depicted in FIG. 1 and FIG. 2. An increased coolant flow volume can result in the removal of a greater amount of heat from a heat-producing IC.

In embodiments, element 120 and 128 can be formed to create a fluidic channel 108 with height 323 through an etching or machining process. Coarse-pitch discrete connecting structures 304 can be located between elements 120 and 128 with fine-pitch discrete connecting structures 130, and, in embodiments, may have a diameter to height ratio of between 1:1 and 2:1.

Figure 4:
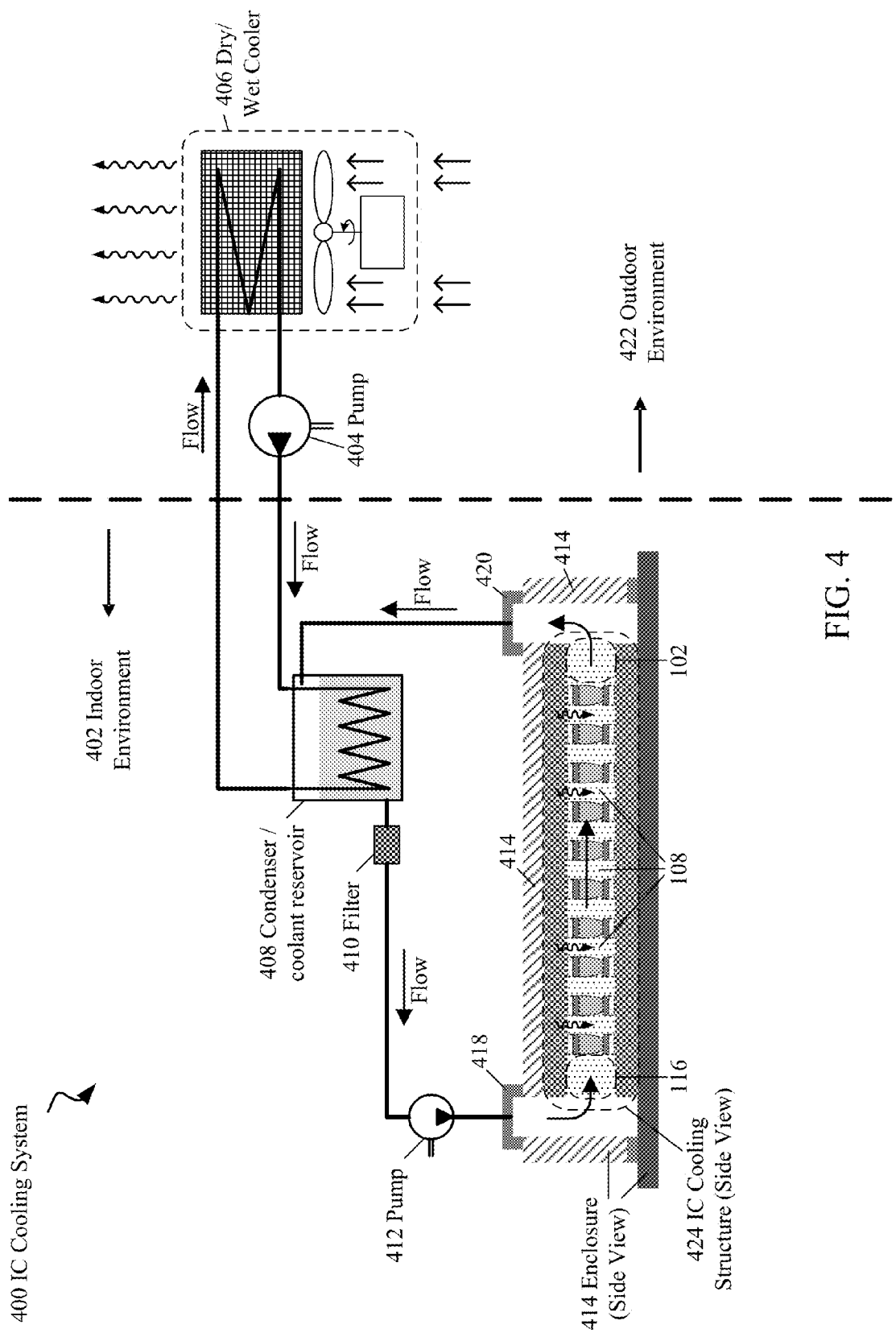
FIG. 4 depicts a schematic diagram of an IC cooling system that includes an IC cooling structure, a primary cooling loop and a secondary cooling loop, according to embodiments consistent with the figures.

FIG. 4 depicts a schematic diagram of an IC cooling system 400 that includes an IC cooling structure 424 located within enclosure 414, a primary cooling loop and a secondary cooling loop, according to embodiments consistent with the figures. IC cooling system 400 may be useful for efficiently removing heat from ICs, particularly from ICs in a stacked configuration of a 3-D IC. FIG. 4 depicts a thermal path for removing heat from the IC cooling structure 424 in thermally conductive contact with an IC, through a primary cooling loop, a secondary cooling loop, and to an outdoor environment 422.

The primary cooling loop includes a condenser/coolant reservoir 408 with an inlet port coupled to the outlet port 420 of the enclosure 414. An outlet port of the condenser/coolant reservoir 408 is also connected to the inlet port of a filter 410, and the outlet port of the filter 410 is connected, through a pump 412, to an inlet port 418 of the enclosure 414. In some embodiments the condenser and coolant reservoir may be combined into one functional unit, e.g., condenser/coolant reservoir 408. In other embodiments, the condenser and coolant reservoir may be two individual functional units, interconnected so that, in operation, the condenser condenses coolant in a vapor phase to a liquid phase, and supplies the liquid phase coolant to the reservoir. The condenser is used to transfer heat from the primary coolant loop to the secondary cooling loop in embodiments involving combined or individual condenser & reservoir functions. In certain embodiments, pump 412 may be a compact pump, also referred to as a "micro pump".

The primary cooling loop described is a closed system for the containment of a refrigerant such as R1234ze, which is pumped by pump 412 through IC cooling structure 424, condenser/coolant reservoir 408, and filter 410. Heat transferred from an IC through IC cooling structure 424 flow boils the refrigerant, which is pumped by pump 412 to condenser/coolant reservoir 408, where the heat is transferred, through the condenser, to the secondary cooling loop. The inlet port 418 of enclosure 414 is located to direct a flow of refrigerant into inlet port 116 of IC cooling structure 424, into fluidic channel 108. The outlet port 102 of IC cooling structure 424 is located to direct the flow of refrigerant from fluidic channel 108, through outlet port 102 of IC cooling structure 424, to outlet port 420 of enclosure 414.

The secondary cooling loop includes the condenser/coolant reservoir 408 connected, through an outlet port, to the dry/wet cooler 406. The dry/wet cooler 406 is also connected to an inlet port of the condenser/coolant reservoir 408 through a pump 404. Connections between the various described elements of the primary cooling loop and the secondary cooling loop may include hoses, tubes or pipes suitable for providing sufficient coolant flow to all of the elements to transfer heat from an IC/IC cooling structure, e.g., 424.

In certain embodiments, the secondary cooling loop can transfer the heat, through circulation, by pump 404, of a secondary coolant from the condenser/coolant reservoir 408 to the dry/wet cooler 406, where heat is generated in an indoor environment 402 is dissipated to the outdoor environment 422. In certain embodiments, if the temperature of the coolant in the secondary loop is sufficiently high, the dry/wet cooler 406 can be located within an indoor environment, which may be useful for recovering heat for heating a commercial or residential structure. In certain embodiments, dry/wet cooler 406 may include passive, e.g., convective, air circulation, while in certain embodiments dry/wet cooler 406 may employ forced air circulation through the use of a fan or blower.

IC cooling system 400 may be significantly more energy-efficient in removing heat dissipated from an IC than a comparable system that uses only air circulation over a heat sink in thermally conductive contact with the IC. For example, calculations show that a system such as IC cooling system 400 will use approximately 5% of the energy that a comparable air-cooled or heating, ventilation, and air conditioning (HVAC) system would use to remove heat dissipated from one or more ICs. An IC cooling system 400 may also have the advantages of being quieter and more compact than a comparable air-cooled system.

In certain embodiments, a single IC and/or IC cooling structure, e.g., 424, can be connected to a primary cooling loop, and in certain embodiments multiple ICs and/or IC cooling structures can be connected to a primary cooling loop. In certain embodiments, one or more primary cooling loops may be coupled to a single secondary cooling loop.

Figure 5:
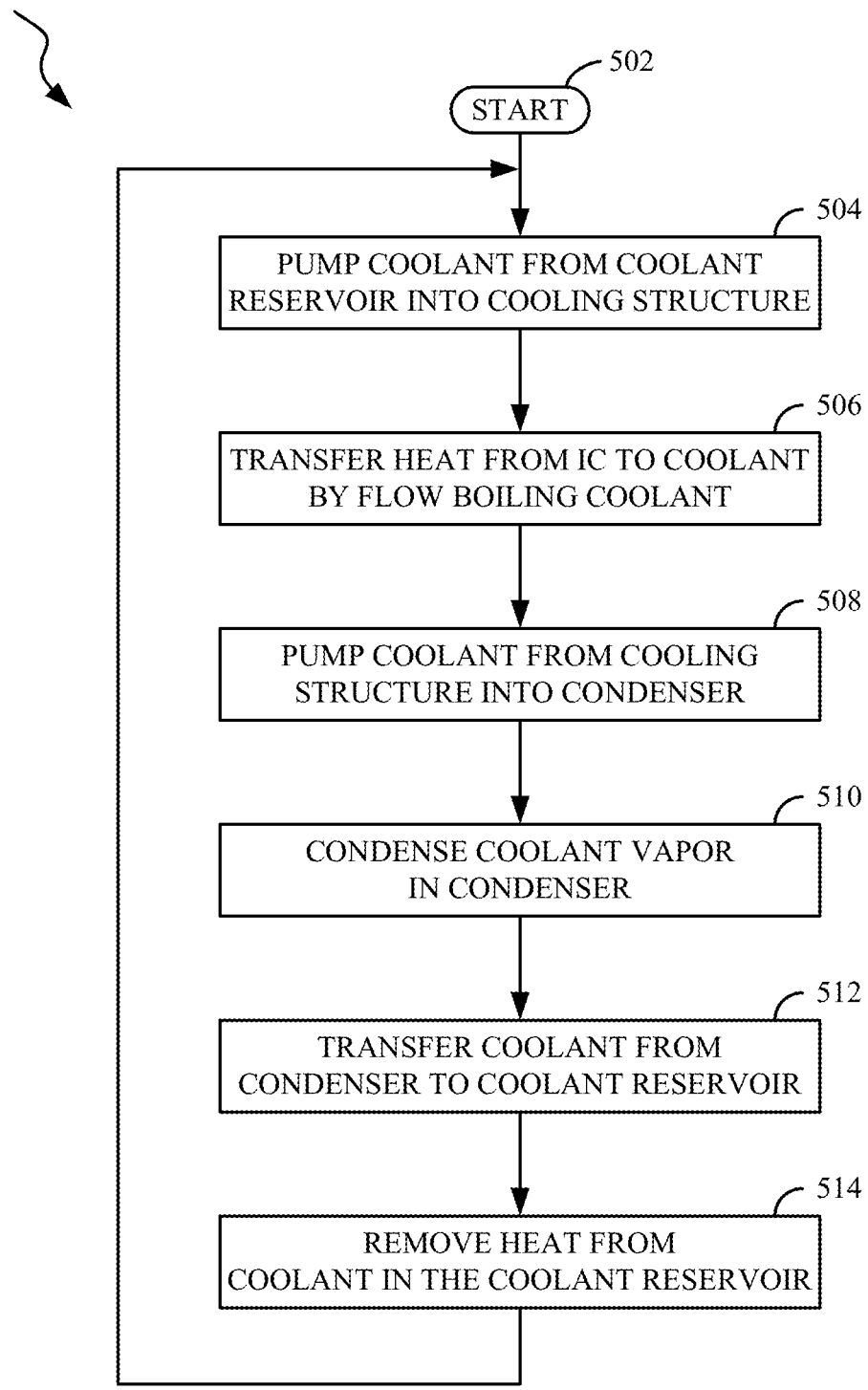
FIG. 5 is a flow diagram illustrating a method for operating an IC cooling structure, according to embodiments consistent with the figures.

FIG. 5 is a flow diagram illustrating a method for operating an IC cooling structure 500, according to embodiments consistent with the figures. An IC cooling structure may be consistent with FIG. 4 and associated descriptions, and a method of operating the structure can also include operating the elements of an IC cooling system. The process 500 moves from start 502 to operation 504.

Operation 504 generally refers to pumping a coolant from a coolant reservoir into the IC cooling structure. In embodiments, a pump or micro pump can be used to pump the coolant or refrigerant, in a liquid phase, from the coolant reservoir to an inlet port of the IC cooling structure. In certain embodiments, an enclosure may be used to direct coolant flow into the inlet port of the IC cooling structure, and to provide a sealed, closed structure around the IC cooling structure. During the pumping of the coolant into the IC cooling structure, a fine-pitch arrangement of discrete connecting structures within fluidic channel boundaries is used to guide coolant flow across surfaces of the IC cooling structure. Once the coolant is pumped from the coolant reservoir into the IC cooling structure, the process moves to operation 506.

Operation 506 generally refers to transferring heat from at least one IC to a coolant by flow boiling the coolant. Discrete connecting structures within the IC cooling structure are used to create fluidic channel boundaries which define fluidic channel(s). Along with the surfaces of the interior of the IC cooling structure, discrete connecting structures are used to transfer heat from at least one IC, and provide nucleation sites for the coolant during flow boiling. The fluidic channels within the IC cooling structure are used to flow boil the coolant while providing room for expansion, i.e., vapor escape paths, of coolant that transitions from a liquid phase to a vapor phase during the flow boiling. Once the heat is transferred from the at least one IC to the coolant, the process moves to operation 508.

Operation 508 generally refers to pumping the coolant from the IC cooling structure and into a condenser. According to embodiments, a portion of the coolant that is pumped from the IC cooling structure may be in a vapor phase, following the flow boiling of operation 506, and a portion of the coolant may be in a liquid phase. The fluidic channel boundaries formed by discrete connecting structures are used to direct the coolant across surfaces within the IC cooling structure, towards an outlet port and out of the IC cooling structure. Once the coolant has been pumped from the IC cooling structure into a condenser, the process moves to operation 510.

Operation 510 generally refers to condensing coolant from a vapor phase to a liquid phase within the condenser. In embodiments, the condenser has a lower temperature than the vapor phase coolant from the IC cooling structure, which enables the vapor phase coolant to condense into a liquid phase. In certain embodiments, a condenser may be integrated with the coolant reservoir, and in certain embodiments the condenser and the coolant reservoir may be separate, coupled, units. Once the coolant is condensed within the condenser, the process moves to operation 512.

Operation 512 generally refers to transferring coolant from the condenser to the coolant reservoir. Once the vapor phase coolant has been condensed into a liquid phase in operation 510, the liquid phase coolant is transferred from the condenser to the coolant reservoir. In some embodiments the condenser and the coolant reservoir are the same functional unit, and in other embodiments the condenser and coolant reservoir are two individual, interconnected functional units. Coolant in a liquid phase in the reservoir then becomes available for recirculation into the inlet port of the IC cooling structure. Once the coolant is transferred from the condenser to the coolant reservoir, the process moves to operation 514.

Operation 514 generally refers to removing heat from the coolant in the condenser. In embodiments, heat may be removed from the coolant in the condenser by the circulation of a coolant in a secondary cooling loop, which may pass through the condenser. Heat may be transferred from the coolant in the condenser to the secondary coolant, which may be circulated to a dry/wet cooler in order to dissipate heat transferred to the secondary coolant. The dry/wet cooler may be located in an outdoor environment, or may be located within a building, in order to recover heat from the secondary coolant. Once heat has been removed from the coolant in the condenser, the process 500 may continue at operation 504.

Figure 6:
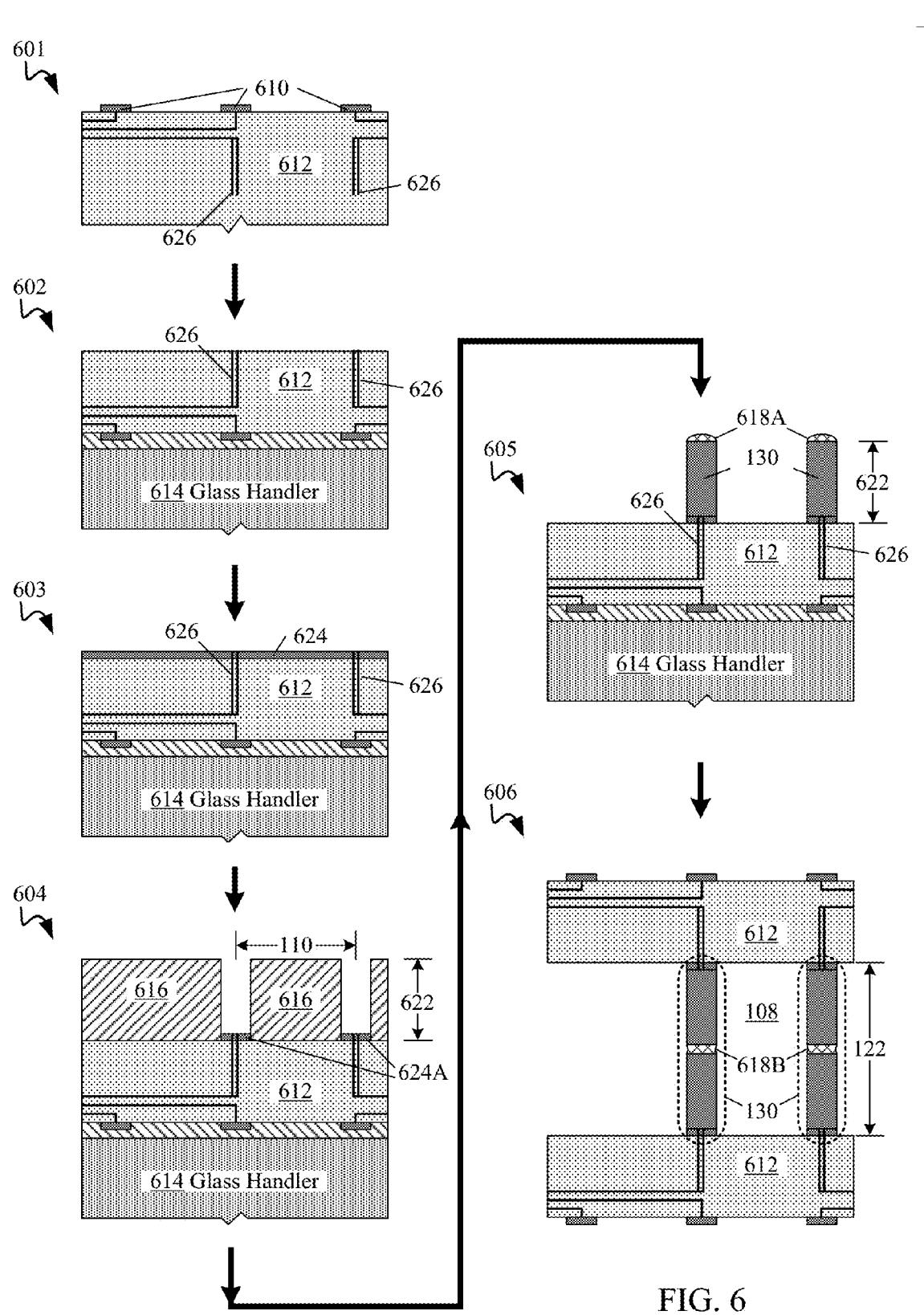
FIG. 6 includes six cross-sectional views illustrating the results of process operations for fabricating an IC cooling structure, according to embodiments consistent with the figures.

FIG. 6 includes six cross-sectional views 601-606 illustrating the results of process operations for fabricating an IC cooling structure, according to embodiments consistent with the figures. An IC thermally connected to the IC cooling structure may have a plurality of active, heat-producing electronic devices, e.g., transistors, formed in a semiconductor material. In certain embodiments the semiconductor material, i.e., die, may be integral to the IC cooling structure, and in certain embodiments the semiconductor die may be in thermally conductive contact with the IC cooling structure. The six views of FIG. 6 depict two semiconductor die integral to the IC cooling structure, however a similar IC cooling structure may be fabricated with generally planar structures such as silicon interposers or IC packaging structures in thermally conductive contact with one or more semiconductor die.

These views illustrate an example process; other views and steps may be possible. The results of one or more process steps may be depicted in each view. For example, a particular view may depict the results of creating discrete connecting structures by depositing material within recesses formed in photoresist, removing the photoresist, and plating top surfaces of the discrete connecting structures with solder.

Processing steps associated with views 601 through 606 may include, but are not limited to, attachment of the element, e.g., an IC, silicon interposer or other electronic package, to a glass handler, photomask deposition and patterning, etching, photomask removal, metal deposition, solder plating, alignment and solder reflow operations. The progression depicted in views 601 through 606 begins with a structure(s) 612 with attachment sites 610 (view 601) and ends with structures 612 and discrete connecting structures 130 assembled to create an IC cooling structure with at least one fluidic channel 108 (view 606).

For simplicity of illustration, completed structures are generally shown in the views as having rectangular cross-sectional profiles, with surfaces orthogonal to each other. This depiction, however, is not limiting; structures may be of any suitable shape, size and profile, in accordance with specific design criteria, lithographic and assembly process limitations and tolerances for a given application. For example, corners shown as having right angles may be rounded, surfaces may have a non-orthogonal relative orientation, and relative dimensional ratios may vary from those depicted in the figures. Views 601 through 606 illustrate a process of manufacturing an IC cooling structure from two structures 612, however, in embodiments, a greater number of structures 612 may be simultaneously included in the fabrication of an IC cooling structure.

View 601 depicts a structure 612 having a generally planar shape, and metallic attachment sites 610 formed on a top surface of the structure. For ease of illustration, views 601-606 depict the structure(s) 612 as semiconductor die, however, in certain embodiments, structure(s) 612 may be silicon interposers or other types of semiconductor packages. Also for ease of illustration, in certain views one structure(s) 612 is depicted, however in embodiments, two or more structure(s) 612 can be used, and may be simultaneously processed, to create an IC cooling structure. In certain embodiments, the depth of metallic routing layers 626, or partial TSVs, used within structure(s) 612 can be approximately 50 µm. Initial semiconductor die 612 may be fabricated with TSVs using an established TSV fabrication process. Metallic attachment sites 610 may be consistent in the shape, size and material used to create attachment sites for ball-grid array (BGA) solder balls.

View 602 depicts the results of mounting, using an adhesive layer, structure 612 to a glass handler 614, and a subsequent semiconductor die thinning operation. Glass handler 614 may be useful in preventing semiconductor die 612 from cracking during a thinning operation, which may include, for example, a chemical-mechanical polishing (CMP) operation. The thinning operation can be used to reduce the thickness of semiconductor die 612 and expose metallic routing layers 626 or partial TSVs within semiconductor die 612 for subsequent attachment to metallic attachment sites. In certain embodiments, structure(s) 612 can be thinned to a thickness of approximately 50 µm. Metallic attachment sites may be useful for attaching discrete connecting structures that provide mechanical, electrical and thermal connections to one or more semiconductor die 612.

View 603 depicts the results of the deposition of a metal layer 624 on the top surface of semiconductor die 612. Metal layer 624 may be useful as a seed layer for subsequent plating of thicker metal onto the top surface of semiconductor die 612.

View 604 depicts the results of the selective etching of metal layer 624 to create attachment sites 624A, followed by the deposition and selective etching of photoresist layer 616. In certain embodiments, pitch 110 of metal layer 624A may be approximately 50 µm, and height 622 may be approximately 80 µm. A width or diameter of metal layer 624A, in embodiments, may be approximately 25 µm. In embodiments, these dimensions may be useful to create tall, fine-pitch discrete connecting structures used to form fluidic channel boundaries that define fluidic channels 108. In embodiments, fluidic channels 108 can be as narrow as 75 µm, by using an arrangement of discrete connecting structures to form fluidic channel boundaries having spacings of 25 µm between adjacent discrete connecting structures. Such fluidic channels 108 may have cross-sectional areas large enough to allow coolant flow sufficient to cool heat-producing ICs.

View 605 depicts the results of plating metal on top of metal layer 624A, adding deposited solder 618A onto the top of the formed discrete connecting structures 130, and removing the photoresist layer 616. In embodiments height 622 of discrete connecting structures 130 may be approximately 75 µm, and discrete connecting structures 130 may be formed from or include copper. Discrete connecting structures 130 may be useful in creating mechanical, electrical and thermal connections to structure 612. Deposited solder 618A may include metals such as tin, lead, silver, copper and bismuth. Discrete connecting structures 130 may be created using a fabrication process consistent with processes used to create TSVs, even though discrete connecting structures 130 are not within a semiconductor substrate.

View 606 depicts the results of assembling two of the semiconductor die/discrete connecting structures 130 assemblies depicted in view 605, in a symmetrical, mirror-image configuration. The assembly process may include positioning the two assemblies to align and provide contact between the corresponding discrete connecting structures 130, holding the alignment while heating the discrete connecting structures 130 and deposited solder 618A, and continuing to hold the alignment while allowing the entire assembly depicted in view 606 to cool, forming reflowed solder 618B from the merged deposited solder 618A. The finished assembly depicted in view 606 can have a height 122 that is approximately 150 µm, which may allow enough coolant to flow between the opposing surfaces of the structure 612 to cool at least one heat-producing IC.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A structure for cooling an integrated circuit (IC), the structure comprising:
   a first element having a first surface;
   a second element in a stacked arrangement with the first element, the second element having a second surface disposed opposite to the first surface;
   a set of discrete connecting structures disposed between the first surface and the second surface, the set of discrete connecting structures including a group of discrete connecting structures in a fine-pitch arrangement, the group having a pitch between 5 µm and 50 µm; and
   a first fluidic channel boundary formed by a structured arrangement of a first portion of the set of discrete connecting structures, the structured arrangement resulting in a first internal fluidic impedance within the first fluidic channel boundary that is greater than an external fluidic impedance outside of the first fluid channel boundary.

2. The structure of claim 1, wherein the structured arrangement of a first portion of the set of discrete connecting structures includes a spacing between adjacent discrete connecting structures.

3. The structure of claim 1, wherein the structured arrangement of a first portion of the set of discrete connecting structures includes, between adjacent discrete connecting structures, a first spacing, at a first location, and a second spacing, at a second location.

4. The structure of claim 1, wherein the first element includes the IC.

5. The structure of claim 1, wherein the first surface is a surface of an electronic package that is in thermally conductive contact with the IC.

6. The structure of claim 1 further comprising a first set of attachment sites on the first surface and a second set of attachment sites on the second surface, the second set of attachment sites corresponding to the first set of attachment sites, wherein the set of discrete connecting structures is attached to the first set of attachment sites and to the second set of attachment sites.

7. The structure of claim 6, wherein the first set of attachment sites and the second set of attachment sites are metallic pads, and wherein the set of discrete connecting structures includes metallic posts, and wherein the set of discrete connecting structures creates, between the first element and the second element, at least one connection type of a group consisting of: an electrical connection, a mechanical connection and a thermal connection.

8. The structure of claim 1, wherein the set of discrete connecting structures includes a second group of discrete connecting structures in a coarse-pitch arrangement, having a pitch greater than 50 µm.

9. The structure of claim 1, wherein the group of discrete connecting structures has a first height that is different than a second height of a second group of discrete connecting structures in a coarse-pitch arrangement.

10. The structure of claim 1, the structure further comprising:
    a second fluidic channel boundary formed by a structured arrangement of a second portion of the set of discrete connecting structures, wherein the structured arrangement resulting in, within the second fluidic channel boundary, a second internal fluidic impedance that is greater than the external fluidic impedance outside of the second fluidic channel boundary; and
    a fluidic channel, defined by the first and second fluidic channel boundaries and the first and second surfaces, wherein the first internal fluidic impedance and the second internal fluidic impedance are each greater than the external fluidic impedance outside of the first and second fluidic channel boundaries, within the fluidic channel.

11. The structure of claim 10, wherein members of at least one fluidic boundary pair of a group consisting of: the first and second fluidic channel boundaries, and the first and second surfaces are positioned in a divergent orientation, to cause the fluidic channel to be tapered.

12. The structure of claim 10, wherein at least one of a group consisting of: a structured arrangement of a first portion of the set of discrete connecting structures and a structured arrangement of a second portion of the set of discrete connecting structures is one of a group consisting of: a substantially linear inline arrangement and a substantially linear staggered arrangement.

13. A system for removing heat from an integrated circuit (IC), the system comprising:
    a structure, the structure including:
      the IC, in thermally conductive contact with a first surface of the structure;
      a first element, the first element having the first surface;
      a second element in a stacked arrangement with the first element, the second element having a second surface disposed opposite to the first surface;
      a first fluidic channel boundary including a first portion of a set of discrete connecting structures, the first fluidic channel boundary disposed between the first surface and the second surface;

a second fluidic channel boundary including a second portion of the set of discrete connecting structures, the second fluidic channel boundary disposed between the first surface and the second surface, the first and second fluidic channel boundaries, and the first and second surfaces defining a fluidic channel;

an inlet port, the inlet port disposed adjacent to a first end of the fluidic channel; and an outlet port, the outlet port disposed adjacent to a second end of the fluidic channel; and a primary cooling loop, the primary cooling loop coupled to the outlet port and to the inlet port, the primary cooling loop including:

a condenser, the condenser having an inlet port coupled to the outlet port of the structure, the condenser further having an outlet port coupled to an inlet port of a first pump; and the first pump, the first pump having an outlet port coupled to the inlet port of the structure, the first pump configured to pump coolant through the structure.

14. The system of claim 13, further comprising an enclosure, the enclosure having an inlet port coupled to the inlet port of the structure, the enclosure further having an outlet port coupled to the outlet port of the structure.

15. The system of claim 13, the system further comprising a secondary cooling loop, the secondary cooling loop including a second pump coupled to a dry/wet cooler, the second pump further coupled to a coolant reservoir associated with the condenser.

16. A method of operating a structure for cooling an integrated circuit (IC), the method comprising:

pumping a coolant from a coolant reservoir into the structure, wherein a first surface of the structure is in thermally conductive contact with the IC, the structure including:

a first element, the first element having the first surface;

a second element in a stacked arrangement with the first element, the second element having a second surface disposed opposite to the first surface;

a first fluidic channel boundary including a first portion of a set of discrete connecting structures, the first fluidic channel boundary disposed between the first surface and the second surface; and a second fluidic channel boundary including a second portion of the set of discrete connecting structures, the second fluidic channel boundary disposed between the first surface and the second surface, wherein the first and second fluidic channel boundaries and the first and second surfaces define a fluidic channel;

an inlet port, the inlet port disposed adjacent to a first end of the fluidic channel; and an outlet port, the outlet port disposed adjacent to a second end of the fluidic channel; and transferring heat from the IC to the coolant by flow boiling the coolant in the fluidic channel;

pumping the coolant from the structure and into a condenser;

condensing, in the condenser, the coolant from a vapor phase to a liquid phase for collection in the coolant reservoir;

removing heat from the coolant in the condenser by circulating a secondary coolant through the condenser.

17. The method of claim 16, wherein during the pumping of the coolant into the structure and from the structure, the inlet port introduces coolant into the fluidic channel and the outlet port allows coolant to be removed from the fluidic channel.

18. The method of claim 16, wherein during the pumping of the coolant into the structure and during the pumping of the coolant from the structure, discrete connecting structures, in a fine-pitch arrangement within the first fluidic channel boundary and within the second fluidic channel boundary, guide a flow of the coolant across the first surface, and across the second surface.

19. The method of claim 16, further comprising circulating, to dissipate heat from the coolant to an outdoor environment, a secondary coolant through the condenser and through a dry/wet cooler disposed in the outdoor environment.

* * * * *